(12) United States Patent
Nakano et al.

(10) Patent No.: US 7,275,938 B2
(45) Date of Patent: Oct. 2, 2007

(54) SOCKET FOR SEMICONDUCTOR PACKAGE

(75) Inventors: Tomohiro Nakano, Fujisawa (JP);
Kiyoshi Adachi, Hiratsuka (JP); Akira Kaneshige, Musashino (JP)

(73) Assignee: Molex Incorporated, Lisle, IL (US)

( * ) Notice: Subject to any disclaimer, the term of this patent is extended or adjusted under 35 U.S.C. 154(b) by 594 days.

(21) Appl. No.: 10/467,502

(22) PCT Filed: Jun. 13, 2002

(86) PCT No.: PCT/US02/18815

§ 371 (c)(1),
(2), (4) Date: Aug. 5, 2003

(87) PCT Pub. No.: WO02/103372

PCT Pub. Date: Dec. 27, 2002

(65) Prior Publication Data

US 2004/0063241 A1 Apr. 1, 2004

(30) Foreign Application Priority Data

Jun. 19, 2001 (JP) .............................. 2001-185322

(51) Int. Cl.
*H01R 12/00* (2006.01)
(52) U.S. Cl. ..................... 439/71; 439/73; 439/331
(58) Field of Classification Search ............... 439/71, 439/73, 140, 141, 331, 268
See application file for complete search history.

(56) References Cited

U.S. PATENT DOCUMENTS

| 5,518,410 A | * | 5/1996 | Masami | .................. 439/71 |
| 5,611,705 A | | 3/1997 | Pfaff | |
| 5,807,104 A | * | 9/1998 | Ikeya et al. | .................. 439/73 |
| 6,069,481 A | | 5/2000 | Matsumura | |
| 6,149,449 A | * | 11/2000 | Abe | .................. 439/268 |
| 6,168,449 B1 | | 1/2001 | Huang et al. | |
| 6,218,849 B1 | | 4/2001 | Kiyokawa | |
| 6,220,870 B1 | * | 4/2001 | Barabi et al. | ............... 439/71 |
| 6,296,505 B1 | * | 10/2001 | Fukunaga et al. | .......... 439/268 |
| 6,439,910 B2 | * | 8/2002 | Hayakawa | ............... 439/266 |
| 6,500,017 B2 | * | 12/2002 | Hayakawa | ............... 439/268 |
| 2001/0024896 A1 | | 9/2001 | Fukunaga | |

* cited by examiner

*Primary Examiner*—Tho D. Ta
(74) *Attorney, Agent, or Firm*—Robert J. Zeitler

(57) ABSTRACT

A socket (10) for a semiconductor package having a plurality of solder balls (5) at its bottom surface. The socket (10) includes a socket body having a plurality of contacts (11) arranged in a shape to correspond in arrangement to the solder balls (5) of the semiconductor package. Each of the contacts (11) has a first and second contact piece contactable with the corresponding solder ball (5) while clamping the corresponding solder ball (5) from both side. The socket (10) includes a placing plate (13) capable of moving between a first position and a second position. The first, or semiconductor placing, position is where the semiconductor package is placed on the placing plate (13) without contact of the solder balls (5) of the semiconductor package with the first and second contact pieces, and the second, or contact, position is where the solder balls (5) of the placed semiconductor package are contactable with the corresponding first and second contact pieces.

16 Claims, 9 Drawing Sheets

SOCKET FOR SEMICONDUCTOR PACKAGE

FIELD OF THE INVENTION

The present invention relates to a socket for use with a semiconductor package, and in particular, a socket that enables quick experiment and evaluation of a semiconductor package having a plurality of solder balls.

BACKGROUND OF THE INVENTION

As a related art, a socket for a semiconductor package having a plurality of solder balls arranged in a grid shape as shown in FIG. 13 is available. This experimental evaluation package socket 300 has a plurality of contacts 301 arranged in a grid shape to correspond to the arrangement of solder balls S of a semiconductor package 350, a socket main body 302 equipped with each of the contacts 301, and a placing plate 303 on which the semiconductor package 350 is placed. First and second contact pieces 304 and 305 are provided to the leading end of each contact 301 to be contactable with the solder ball S while clamping the same from the both sides.

The semiconductor package 350 is inserted through an opening into the socket 300 of the above construction so that the solder balls 350 are respectively disposed between the first contact pieces 304 and the second contact pieces 305, and a slider 306 is moved upwardly in the drawing, thereby abutting slope portions 306a and 306b provided to the slider 306 against slope portions 304a and 305a of the first and second contact pieces 304 and 305. This causes the first and second contact pieces 304 and 305 to be displaced to be close to each other, thereby contacting and clamping the solder balls S from both sides.

In the socket 300 of the above construction, the leading ends of the first and second contact pieces 304 and 305 extends above the upper surface (the placing surface) of the placing plate 303, and therefore when the semiconductor package 350 is inserted, the solder ball S may be caught by the first and second contact pieces 304 and 305 or the like, resulting in difficulty in disposing the solder ball S between the first contact piece 304 and the second contact piece. This problem frequently occurs particularly in case of being an IC package in which the solder balls are arranged in a narrow pitch and full grid.

The aforementioned problem can be solved by accurately mating the solder balls S to the first and second contact pieces 304 and 305 when the package socket 350 is inserted, but this accurate mating requires the time-consuming work, causing another problem, i.e. a difficulty in conducting an experiment and evaluation for the semiconductor package in a speedy fashion.

OBJECTS AND SUMMARY OF THE INVENTION

An object of the present invention is to provide a socket for a semiconductor package which enables speedy experiment and evaluation for the semiconductor package.

Another object of the present invention is to provide a socket for a semiconductor package, which can rapidly dispose solder balls between first contact pieces and second contact pieces when the semiconductor package is inserted, and enables a speedy experiment and evaluation for the semiconductor package.

Briefly, and in accordance with the foregoing, the present invention is directed to a socket for a semiconductor package having a plurality of solder balls at its bottom surface. The socket includes a socket body having a plurality of contacts arranged in a shape to correspond in arrangement to the solder balls of the semiconductor package. Each of the contacts has a first and second contact piece contactable with the corresponding solder ball while clamping the corresponding solder ball from both side. The socket includes a placing plate capable of moving between a first position and a second position. The first, or semiconductor placing, position is where the semiconductor package is placed on the placing plate without contact of the solder balls of the semiconductor package with the first and second contact pieces, and the second, or contact, position is where the solder balls of the placed semiconductor package are contactable with the corresponding first and second contact pieces.

With this arrangement, at the semiconductor package placing position, the placement is possible without the contact of the solder balls of the semiconductor package with the first and second contact pieces. Therefore, when the semiconductor package is inserted, the solder balls can be rapidly located between the respective first contact pieces and the respective second contact pieces without being caught by the first and second contact pieces, and thus the experiment and evaluation for the semiconductor package can be conducted in a speedy fashion.

The semiconductor package placing position is set to be away from the first and second contact pieces in a height direction of the socket main body (i.e. the semiconductor package socket) by a length dimension corresponding to at least a diameter dimension of the solder ball. This arrangement ensures that the solder balls do not make contact with the first and second contact pieces when the semiconductor package is placed onto the placing plate.

The semiconductor package socket may be provided with a socket cover movable in a height direction of the socket main body (i.e. the semiconductor package socket) with respect to the socket main body; and moving means for moving the placing plate between the semiconductor package placing position and the contact position in the height direction of the socket main body (i.e. the semiconductor package socket) in linking with movement of the socket cover. With this arrangement, the socket cover can be moved using an available mechanical device or the like, and thus the experiment and evaluation for the semiconductor package can be automated.

The semiconductor package socket may be provided with fixing means for fixing the semiconductor package onto the placing plate in linking with the movement of the socket cover. With this arrangement, since the floating-up of the semiconductor package can be eliminated, the stable contact can be obtained.

The semiconductor package socket can be provided with displacing means for displacing the first and second contact pieces in linking with the movement of the socket cover. With this arrangement, it is possible to move the socket cover using an available mechanical device or the like to displace the first and second contact pieces between a contact position and a non-contact position with respect to the solder ball, thereby enabling the automation of the experiment and evaluation for the semiconductor package.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT OF THE INVENTION

Figure 1:
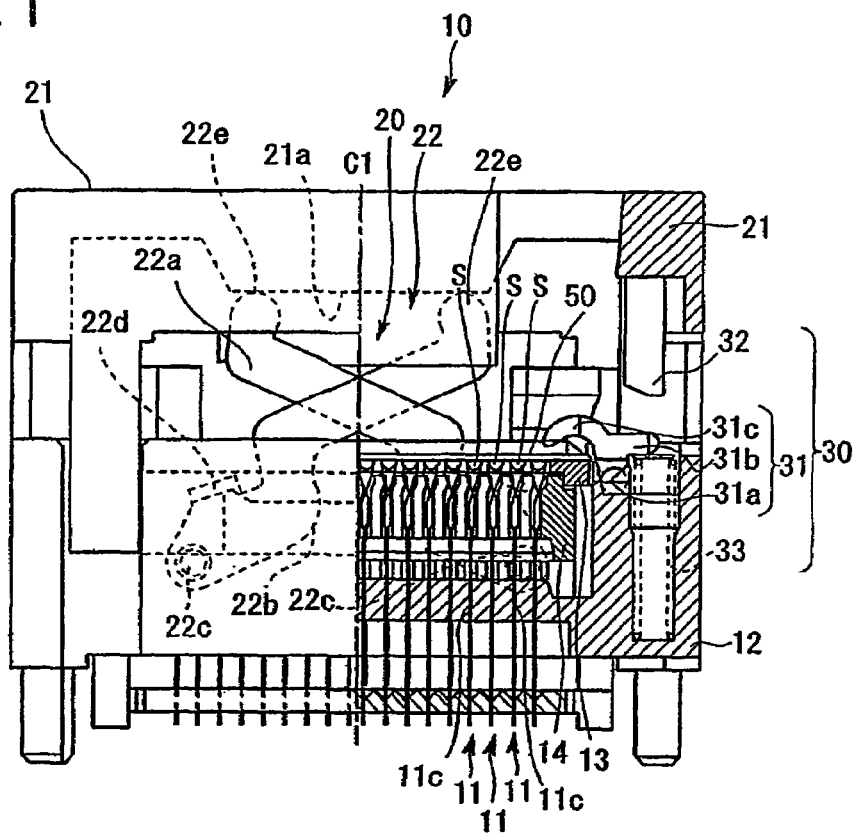
FIG. 1 is a front view of a socket for a semiconductor package according to the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
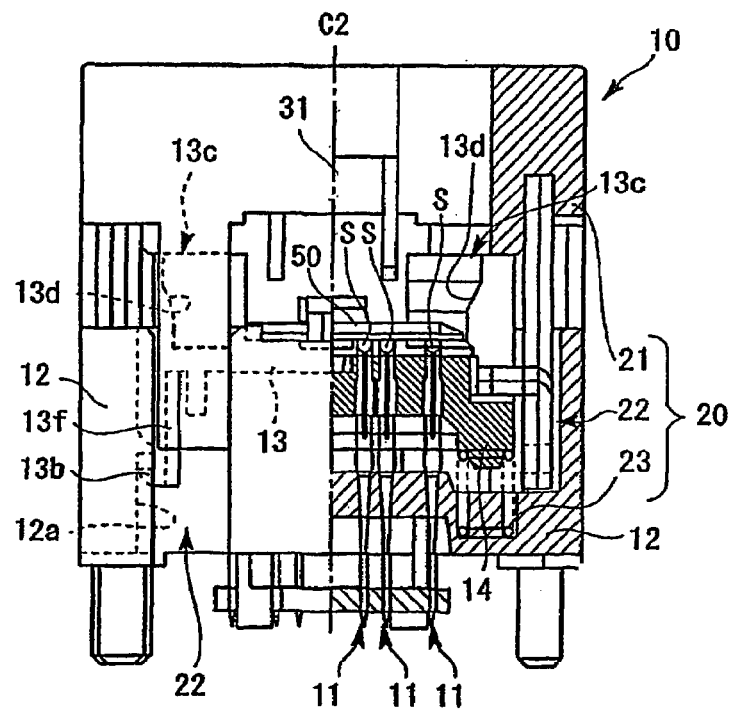
FIG. 2 is a side view of the socket for the semiconductor package according to the present invention.

As shown in FIGS. 1 and 2, the socket 10 is constructed as a socket for experiment and evaluation of a semiconductor package 50 having, on its bottom surface, a plurality of solder balls S arranged in a grid shape. The socket 10 includes a plurality of contacts 11, a socket main body 12 equipped with these contacts 11, a placing plate (called also an adapter) 13 on which the semiconductor package 50 is placed, and a slider 14.

The socket 10 may further include a slider elevating mechanism 20 for moving the slider 14 in the height direction of the socket 10 (the up and down direction in FIG. 1, hereafter referred to as the vertical direction), and a fixing mechanism 30 which fixes the semiconductor package 50 onto the plate 13 and which moves the placing plate 13 in linking with the movement of a socket cover 21. The fixing mechanism 30 mainly corresponds to moving means and fixing means in the present invention, and the slider elevating mechanism 20 mainly corresponds to displacing means in the present invention.

Figure 7:
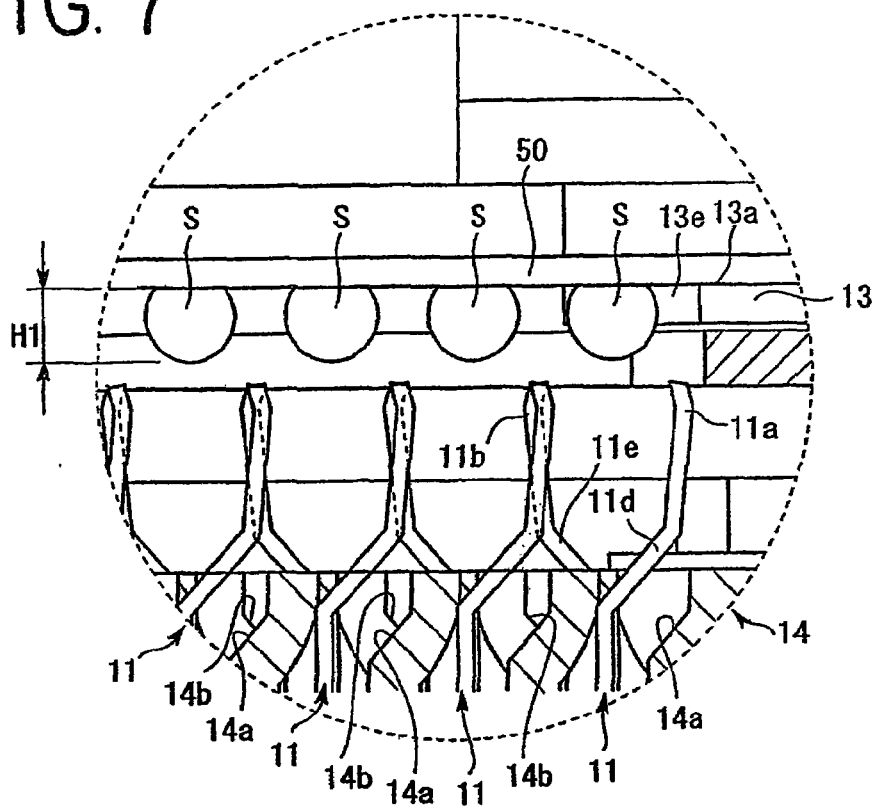
FIG. 7 is a view for explaining a positional relationship between a placing plate 13 located at a semiconductor package placing position, and each contact 11.

The contacts 11 are disposed in a grid shape to respectively correspond, in location, to solder balls S. As shown in FIGS. 1 and 7, each of the contact 11, preferably formed from an electrically conductive metal plate subjected to a press-punching, has a contact base portion 11c fixed to the socket main body 12, and first and second contact pieces 11a and 11b, which extend upwardly from the leading end of the contact base portion 11c through slope portions 11d and 11e and which are contactable with the respective solder balls S so as to clamp the solder balls S from both sides.

Figure 8:
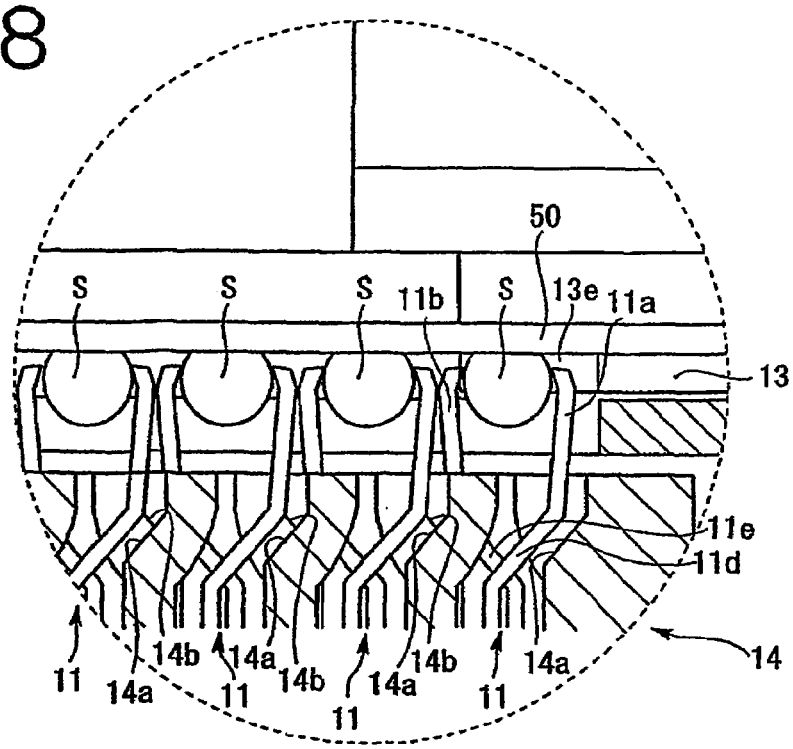
FIG. 8 is a view for explaining a positional relationship between the placing plate 13 located at a contact position, and each contact 11.

The slope portions 11d and 11e of each contact 11 abut against slope portions 14a and 14b provided to the slider 14 when the slider 14 is moved upwardly in the height direction of the socket 10 (in the upward direction in FIG. 7, hereafter referred to as upwardly), to thereby displace the first contact portion 11a and the second contact portion 11b in the direction to close to each other (see FIG. 8). This causes the first and second contact pieces 11a and 11b to contact the solder ball S of the semiconductor package 50 placed on the placing plate 13 in such a manner as to clamp the solder ball S from both sides.

Since the contact 11 has a spring property, if the slider 14 is moved downwardly to release the abutment against the contact 11, the first and second contact pieces 11a and 11b are restored to their original shapes (see FIG. 7). A clearance between the first contact piece 11a and the second contact piece 11b in this restored state is set to be slightly larger than the diameter of the solder ball S.

The placing plate 13 is moved between a first, or semiconductor package placing, position (a position of the placing plate 13 shown in FIGS. 1 and 7), at which the semiconductor package 50 is placed without the contact of the solder balls S with the first and second contact pieces 11a and 11b, and a second, or contact, position (a position of the placing plate 13 shown in FIGS. 3 and 8), at which the solder balls S of the placed semiconductor package 50 are contactable with the first contact pieces 11a and the second contact pieces 11b.

The semiconductor package placing position is set, as shown in FIG. 7, to be upwardly away from the leading ends of the first and second contact pieces 11a and 11b. This distance is preferably a length dimension H1 corresponding to at least the diameter dimension of the solder ball S. However, dimensions less that H1 would still work so long as the contact pieces 11a and 11b do not extend such that the solder balls S of the semiconductor package male contact with the contact pieces 11a, 11b when the semiconductor package is places on the placing pate when the socket is in the semiconductor package placing position. This makes it possible to place the semiconductor package 50 without the contact of the solder balls S with the first and second contact pieces 11a and 11b of the contacts 11.

The placing plate 13 is formed to a plate shape being substantially rectangular in a plane view, and its upper surface is provided with a placing surface 13a on which the semiconductor package 50 is placed. Leg portions 13f provided at its leading ends with engagement nails 13b are provided to respective corner portions of the bottom surface of the placing plate 13 so as to be symmetric with respect to center lines C1 and C2 of the socket 10. The engagement nails 13b are respectively engaged with four vertically extending grooves 12a formed in the inner wall of the socket main body 12 so as to guide the movement of the placing plate 13 with respect to the socket main body 12.

An unillustrated spring is disposed between the placing plate 13 and the socket main body 12 in a state of being contracted axially (in the vertical direction in FIG. 1). The placing plate 13 is pushed and moved upwardly by the restoring force of the spring into its original shape. If the placing plate 13 is moved upwardly by a predetermined amount, the engagement nails 13b respectively abut against the upper end surfaces of the grooves 12a formed in the socket main body 12 so as to inhibit a further upward movement of the placing plate 13, whereby the placing plate is stopped. This stopped position is the semiconductor package placing position.

The four corner portions of the upper surface of the placing plate 13 are respectively provided with semiconductor package introducing portions 13c for introducing the semiconductor package 50, inserted from the above of the socket 10, to the placing surface 13a. The semiconductor package introducing portion 13c has a slope surface 13d inclined with respect to the placing surface 13a of the placing plate 13 so as to introduce the semiconductor package 50 to a predetermined position on the placing surface 13a.

The inserted semiconductor package 50 slides downwardly toward the placing surface 13a with its periphery being guided by at least one of the slope surfaces 13d. In this manner, the semiconductor package 50 is placed at the predetermined position on the placing surface 13a.

As shown in FIG. 7, the placing plate 13 is formed with a solder ball insertion hole 13e that penetrates from the placing surface 13a to the bottom surface, and that elongates in the right and left direction in the drawing.

The slider 14 is supported to the socket main body 12 via a spring 23. The slider 14 is provided with the slope portions 14a and 14b which abut against the slope portions 11d and 11e of the contacts 11.

As shown in FIGS. 1 and 2, the slider elevating mechanism 20 is mainly constructed by the socket cover 21, a cross link 22, and the spring 23. The socket cover 21 is mounted to the socket main body 12 to be movable in the vertical direction with respect to the socket main body 12. The cross link 22 is disposed on each side of the placing plate 14.

The cross link 22 is provided with a pair of levers 22a and 22b intersecting each other. The levers 22a and 22b have, at their proximal ends, rotational shafts 22c that are located symmetric to each other with respect to the center line C1 and that are inserted into bearing holes (not shown) of the socket main body 12, so that each of the levers 22a, 22b are pivotable about the corresponding rotational shaft 22c.

The levers 22a and 22b have, at their proximal side, slider main body pressing portions 22d, that are protruded from the respective side surfaces in a flange manner, and that are located symmetric to each other with respect to the center line C1. Each of the slider main body pressing portion 22d abuts against the upper surface of the slider 14 so as to inhibit further pivotal movements of the levers 22a, 22b. The leading ends of the levers 22a and 22b are provided with arcuate slide portions 22e that are slid along the inner side upper surface 21a of the socket cover 21 and that are located symmetric to each other with respect to the center line C1.

The socket cover 21 is attached to the socket main body 12 in a state in which the inner side upper surface 21a thereof abuts against the slide portions 22e of the levers 22a and 22b.

Next, an operation of the slider elevating mechanism 20 will be described with reference to FIGS. 1 to 6.

Figure 3:
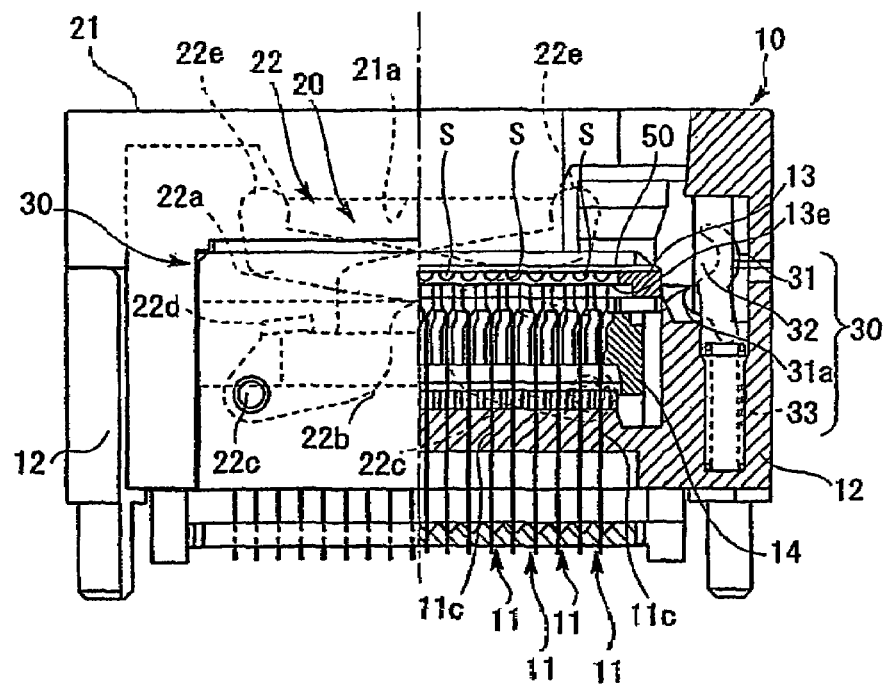
FIG. 3 is a front view of the socket for the semiconductor package according to the present invention.
Figure 4:
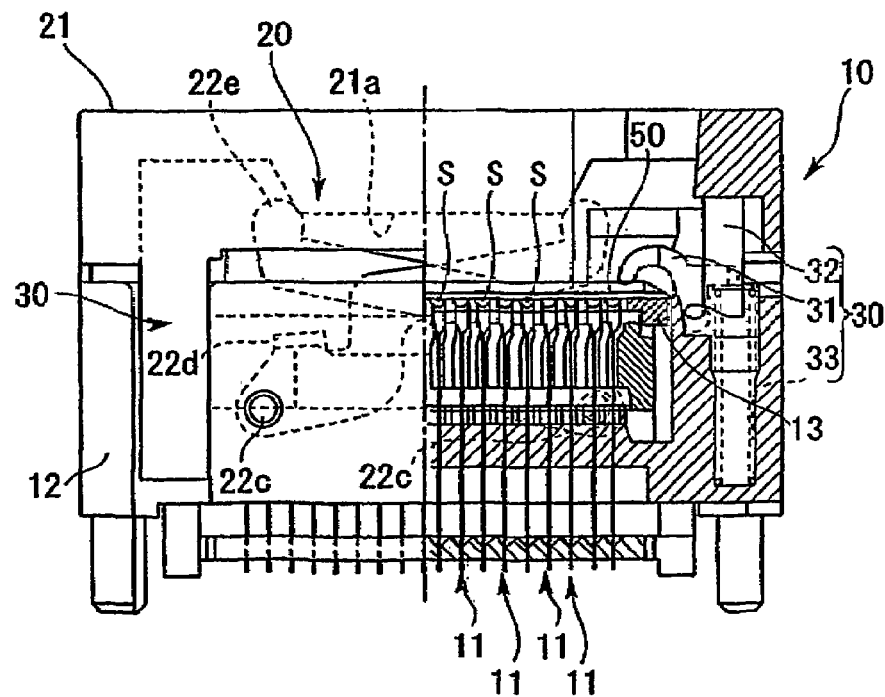
FIG. 4 is a front view of the socket for the semiconductor package according to the present invention.
Figure 5:
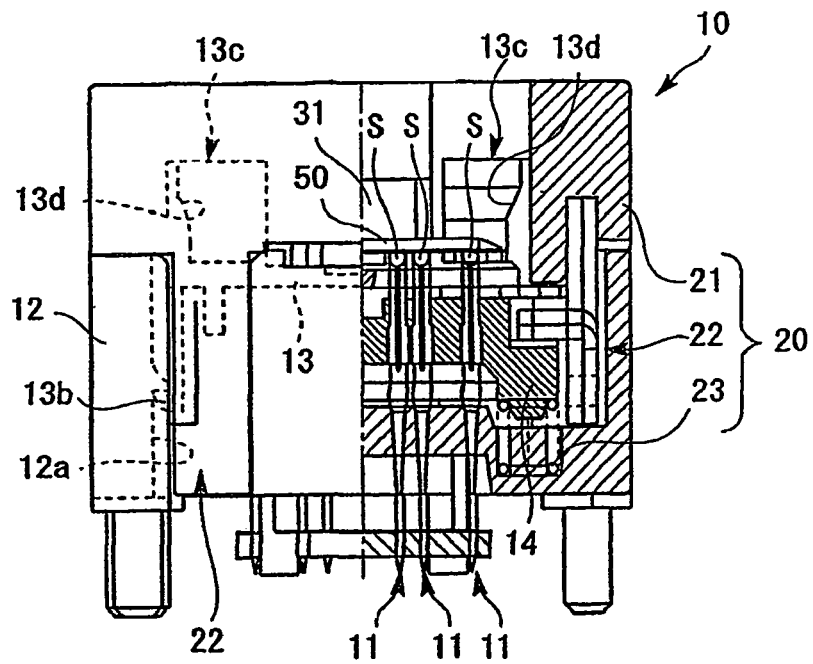
FIG. 5 is a side view of the socket for the semiconductor package according to the present invention.
Figure 6:
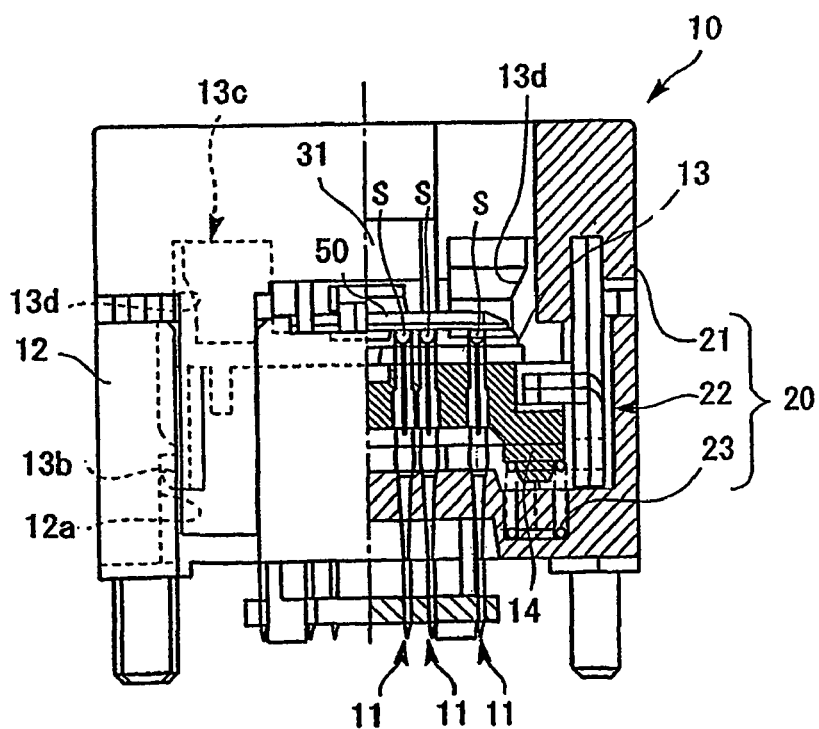
FIG. 6 is a side view of the socket for the semiconductor package according to the present invention.

FIGS. 1 and 2 show a state in which the slider 14 and the socket cover 21 are located at their uppermost positions. When the socket cover 21 is depressed from its uppermost position using a mechanical device or the like to be moved downwardly in FIGS. 1 and 2, the slide portions 22e of the levers 22a and 22b are slid along the inner side upper surface 21a of the socket cover 21. In conjunction therewith, the levers 22a and 22b are pivoted about the rotational shafts 22c, so that the slider main body pressing portions 22d depress the slider 14 to downwardly move the slider 14 to the lowermost position in FIG. 1. FIGS. 3 and 5 show a state in which the slider 14 and the socket cover 21 are located at their lowermost positions. FIGS. 4 and 6 show a state in which the slider 14 and the socket cover 21 are located between their uppermost positions and their lowermost positions.

The movement of the slider 14 from its uppermost position to its lowermost position contracts the spring 23 axially (in the vertical direction in FIG. 1), which is disposed between the slider 14 and the socket main body 12. If the force for depressing the socket cover 21 is removed, the slider 14 is pushed upwardly by the restoring force of the spring 23 into its original shape, thereby being moved to the uppermost position.

As shown in FIGS. 1 and 2, the fixing mechanism 30 is mainly constructed by a pusher 31, a pusher pressing member 32, and a spring 33.

The pusher 31 is disposed at each side of the placing plate 13. A rotational shaft 31a of the pusher 31 is inserted into a bearing hole (not shown) formed in the socket main body 12 so that the pusher 31 is pivotable about the rotational shaft 31a. The spring 33 in the axially contracted state is disposed between the proximal end 31b and the socket main body 12.

The pusher 31 is pivoted toward the placing plate 13 side by the restoring force of the spring 33 into its original shape, so that the leading end 31c abuts against the upper surface of the placing plate 13 and attempts to be pivoted further in the same direction. For this reason, in the case where the semiconductor package 50 is placed on the placing surface 13a of the placing plate 13, the semiconductor package 50 is clamped between the leading end 31c of the pusher 31 and the placing plate 13. In this manner, the semiconductor package 50 is fixed to the placing plate 13.

Further, as mentioned above, since the leading end 31c of the pusher 31 abuts against the upper surface of the placing plate 13 (the upper surface of the semiconductor package 50 if the semiconductor package 50 is placed), and attempts the further pivotal movement in the same direction, the placing plate 13 is pushed downwardly to be moved downwardly in the height direction of the socket 10 (in the downward direction in FIG. 7, hereafter referred to as downwardly).

If the placing plate 13 is moved downwardly by a predetermined amount, the lower surface of the placing plate 13 abuts against an unillustrated protruded portion formed in the socket main body 12 so that a further downward movement of the placing plate 13 is inhibited, and the placing plate 13 is stopped. This stopped position is the contact position. The downward movement of the placing plate 13 axially contracts the unillustrated spring disposed between the placing plate 13 and the socket main body 12.

Next, an operation of the fixing mechanism 30 will be described with reference to FIGS. 1 to 6.

FIGS. 1 and 2 show a state in which the placing plate 13 is located at the contact position (the lowermost position), and the socket cover 21 is located at the uppermost position. When the socket cover 21 is depressed from the uppermost position using a mechanical device or the like to be moved downwardly in FIGS. 1 and 2, the leading end of the pusher pressing member 32, which extends downwardly from the inner side upper surface 21a of the socket cover 21, abuts against the proximal end 31c of the pusher 31. If the socket cover 21 is depressed further in this state, the pusher 31 is pivoted about the rotational axis 31a.

This releases the fixing of the placing plate 13 by the pusher 31, and thus the placing plate 13 is pushed upwardly by the restoring force of the unillustrated spring into the original shape, disposed between the placing plate 13 and the socket main body 12, whereby the placing plate 13 is moved to the semiconductor package placing position (the uppermost position). By this pivotal movement of the pusher 31, the proximal end 31b of the pusher 31 axially contracts the spring 33. FIGS. 3 and 5 show a state in which the placing plate 14 is located at the semiconductor package placing position (the uppermost position). FIGS. 4 and 6 show a state in which the placing plate 13 is located between the contact position (the lowermost position) and the semiconductor package placing position (the uppermost position).

When the force applied for pushing the socket cover 21 downwardly is removed, the pusher 31 is pivoted, by the restoring force of the spring 33 into the original shape, in the direction opposite from the anterior pivoting direction to be returned to the original position.

Next, an operation for inserting the semiconductor package 50 into the socket 10 will be discussed. FIGS. 9 to 12 are views for explaining a process in which the semiconductor package is inserted into the semiconductor package socket according to the present invention to be placed thereon.

As shown in FIGS. 3 and 5, if the socket cover is pushed downwardly to the lowermost position, the slider 14 is pushed downwardly by the slider elevating mechanism 20 to be moved to the lowermost position, thereby releasing the abutment of the slider 14 against the contacts 11. Therefore, the first and second contact pieces 11a and 11b of the each contact 11 are restored to their original shapes, and the clearance slightly larger than the diameter of the solder ball S is formed between the first contact piece and the second contact pieces.

When the socket cover 21 is pushed downwardly to the lowermost position, the fixing of the placing plate 13 by the pusher 31 is released by the fixing mechanism 30, so that the placing plate 13 is pushed upwardly by the action of the unillustrated spring disposed between the placing plate 13 and the socket main body 12, and the placing plate 13 is moved to the semiconductor package placing position (the uppermost position) along the guide grooves 12a of the socket main body 12.

Figure 9:
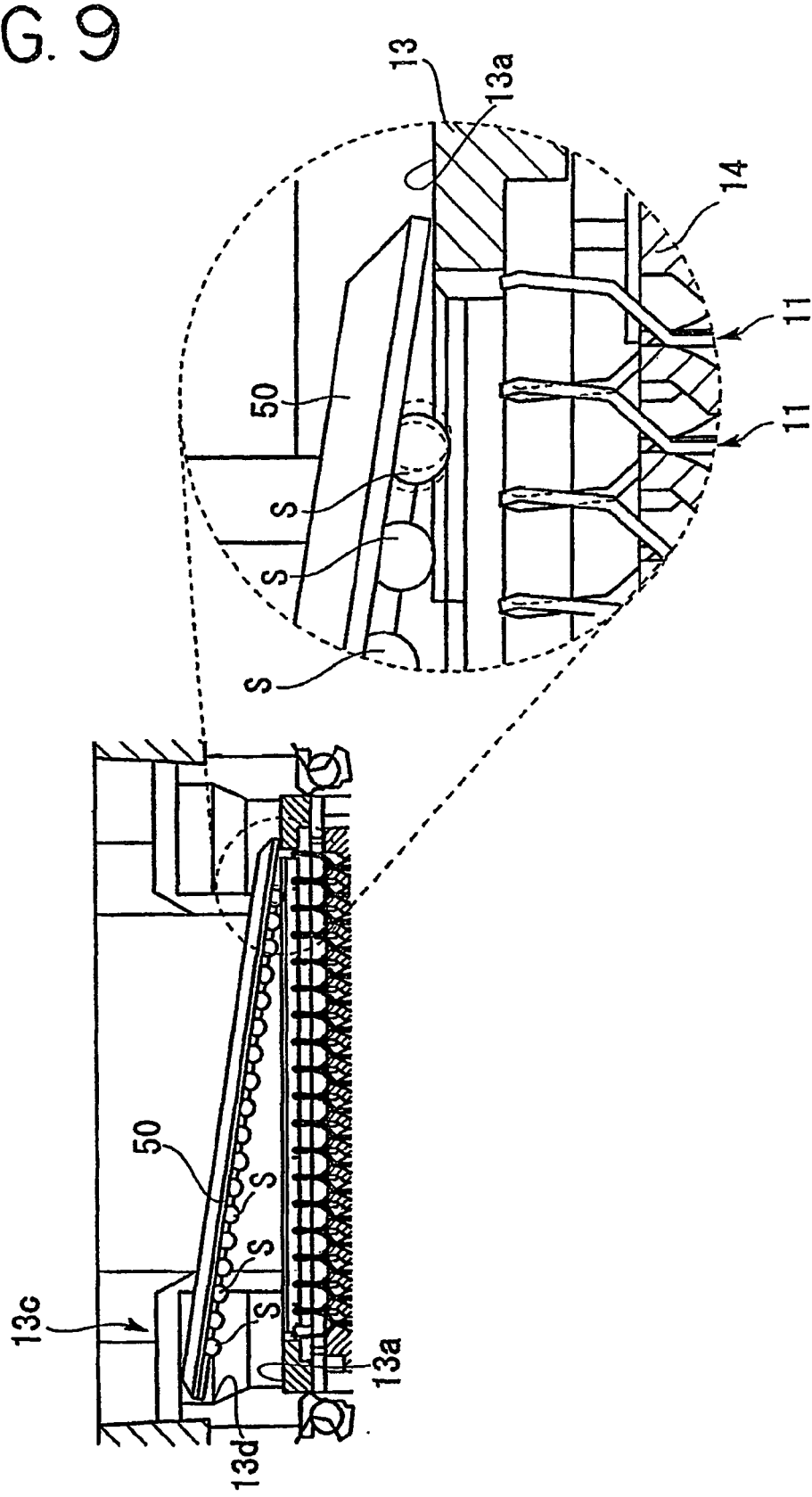
FIG. 9 is a view for explaining a process in which the semiconductor package is inserted into the semiconductor package socket according to the present invention to be placed thereon.
Figure 10:
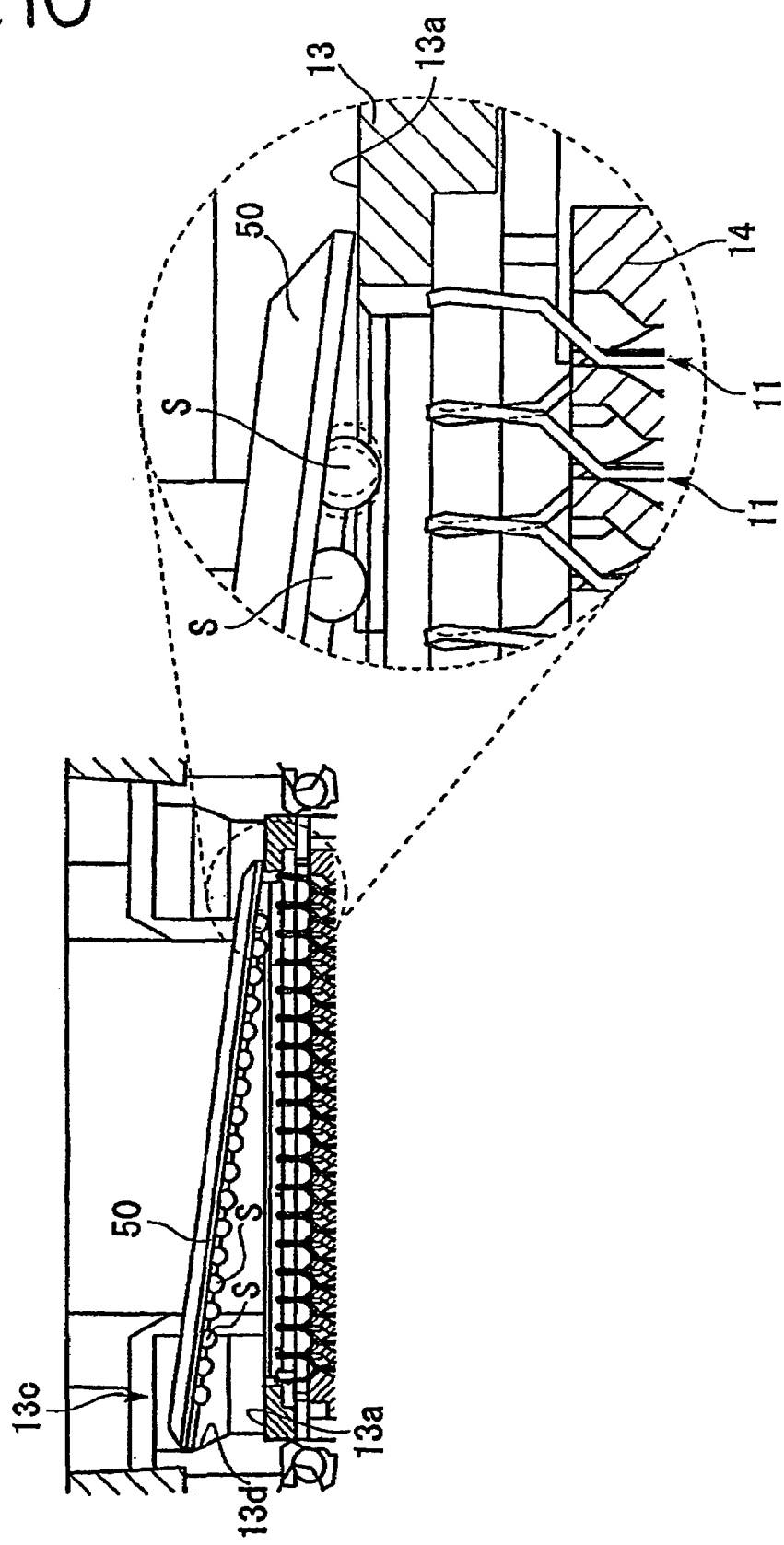
FIG. 10 is a view for explaining the process in which the semiconductor package is inserted into the semiconductor package socket according to the present invention to be placed thereon.
Figure 11:
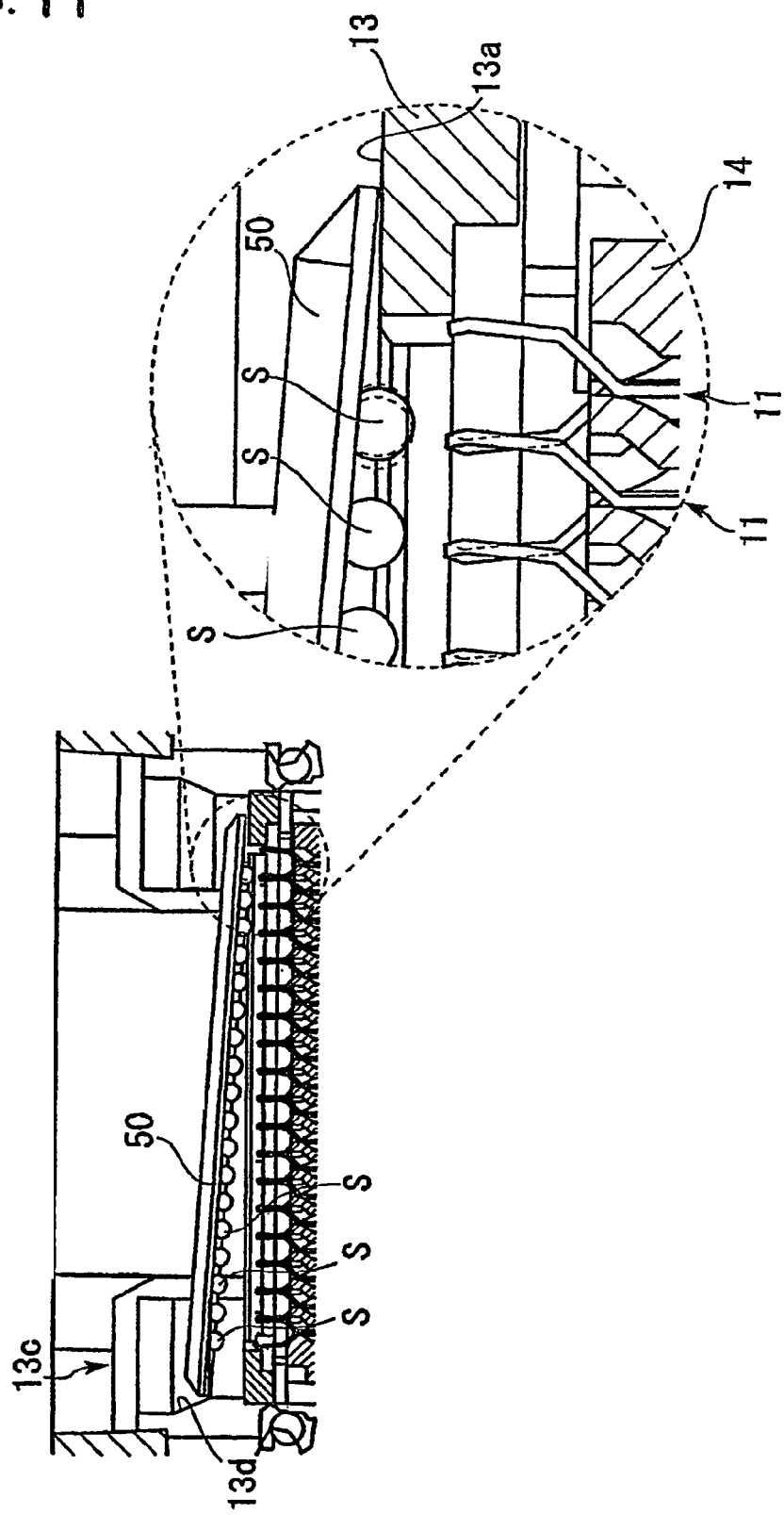
FIG. 11 is a view for explaining the process in which the semiconductor package is inserted into the semiconductor package socket according to the present invention to be placed thereon.
Figure 12:
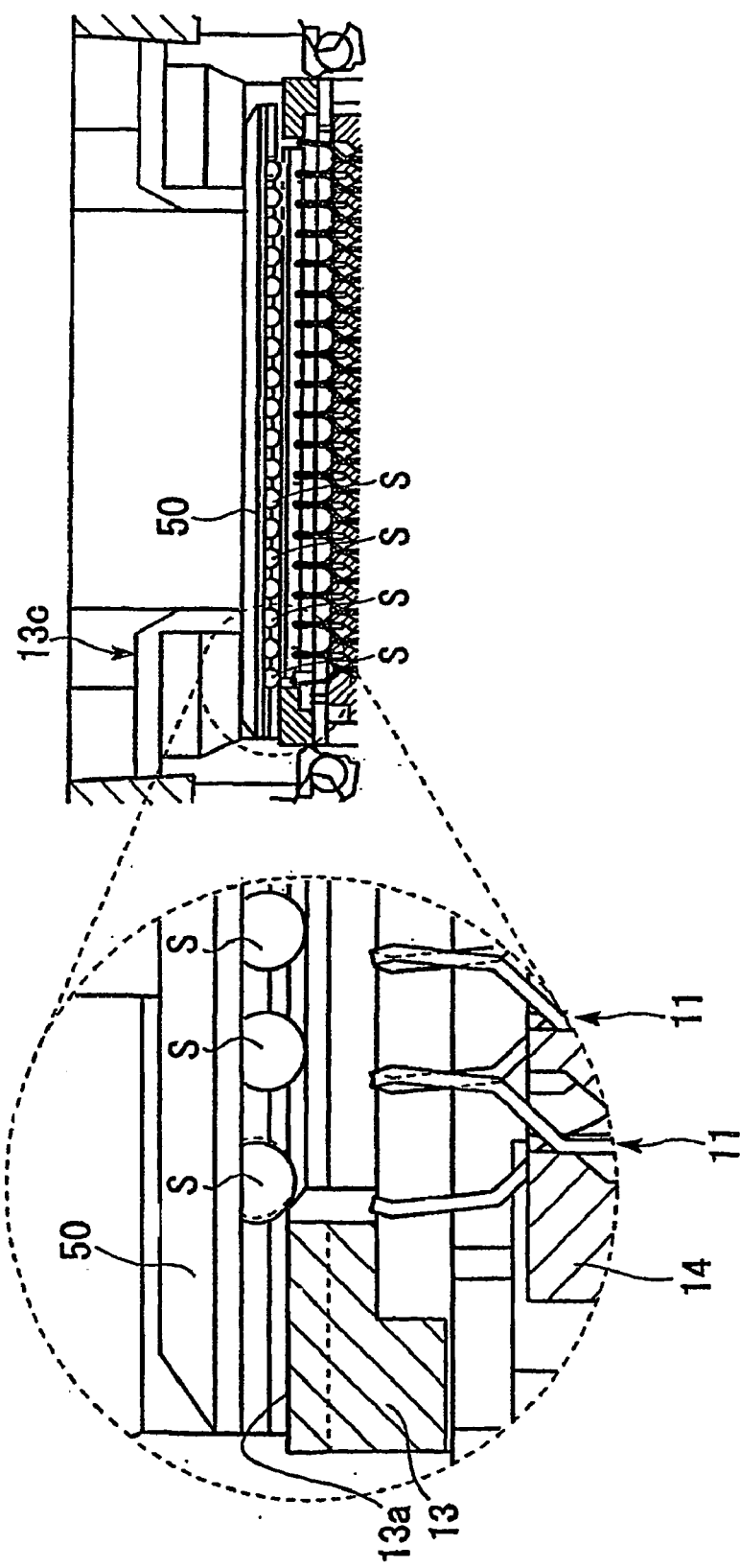
FIG. 12 is a view for explaining the process in which the semiconductor package is inserted into the semiconductor package socket according to the present invention to be placed thereon.
Figure 13:
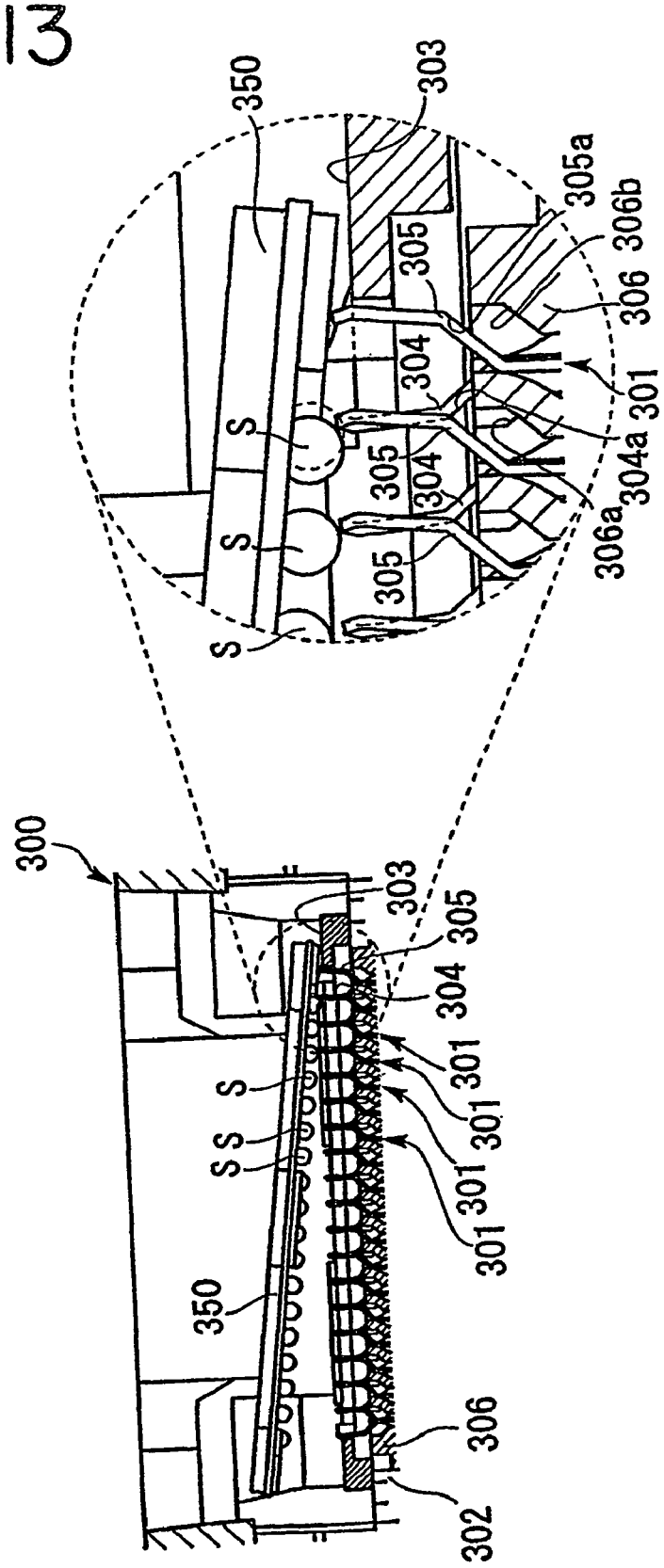
FIG. 13 is a view for explaining a problem encountered in a related art of the semiconductor package socket according to the present invention.

In this state in which the placing plate 13 is located at the semiconductor package placing position, if the semiconductor package 50 is inserted from the above of the socket 10, the periphery of the semiconductor package 50 is slid along the slope surfaces 13d, constructing the semiconductor package introducing portion 13c, toward the placing surface 13a as shown in FIGS. 9 to 11. This causes the solder balls S of the semiconductor package 50 to be inserted into the solder ball insertion hole 13e formed in the placing plate 13, whereby the semiconductor package 50 is placed at the predetermined position on the placing plate 13 (see FIG. 12).

The semiconductor package placing position is set to be away from the first and second contact pieces 11a and 11b by the length dimension H1 corresponding to at least the diameter dimension of the solder ball S. For this reason, when the semiconductor package 50 is inserted, the solder balls S are prevented from contacting the first and second contact pieces 11a and 11b.

Next, when the force applied for pushing the socket cover 21 downwardly is removed, the pusher 31 is pivoted toward the placing plate 13 side by the action of the spring 33 constructing the fixing mechanism 30. Since the semiconductor package 50 is placed on the placing surface 13a, the semiconductor package 50 is clamped between the leading end 31c of the pusher 31 and the placing plate 13. In this manner, the semiconductor package 50 is fixed onto the placing plate 13.

Sine the pusher 31 is urged to make the further pivot movement in the same direction after its leading end 31a abuts against the upper surface of the semiconductor package 50, the placing plate 13 is pushed downwardly to be moved along the grooves 12a of the socket main body 12 to the contact position (the lowermost position), (see FIG. 8.) At the contact position, the solder ball of the semiconductor package 50 placed on the placing plate 13 is located between the first contact piece 11a and the second contact piece 11b. Since the clearance between the first contact piece and the second contact piece is set to be slightly larger than the diameter of the solder ball S, the solder ball is inserted relatively smoothly.

Slightly delayed from this, the slider 14 is pushed upwardly by the slider elevating mechanism 20 to be moved to the uppermost position, thereby contacting the contacts 11. In more detail, the slope portions 14a and 14b provided to the slider 14 abut the slope portions 11d and 11e of the contacts 11 to displace the first contact pieces 11a and the second contact pieces 11b to be close to each other (see FIG. 8).

Accordingly, the first and second contact pieces 11a and 11b contact the solder balls S of the semiconductor package 50 placed on the placing plate 13 located at the contact position, in such a manner as to clamp the solder balls S from both sides.

While a preferred embodiment of the present invention is shown and described, it is envisioned that those skilled in the art may devise various modifications of the present invention without departing from the spirit and scope of the appended claims.

The invention claimed is:

1. A socket connector for use with a semiconductor package, the semiconductor package including a plurality of solder balls on a bottom surface of the semiconductor package, the socket connector comprising:
   a plurality of contacts, arranged in a shape to correspond in arrangement to the solder balls, each contact having a first contact piece and a second contact piece, the first and second contact piece contactable with the corresponding solder ball;
   a socket main body equipped with the contacts;
   a placing plate moved between a semiconductor package placing position at which the semiconductor package is placed on the placing plate without contact of the solder balls of the semiconductor package with the first and second contact pieces, and a contact position at which the solder balls of the placed semiconductor package are contactable with the corresponding first and second contact pieces;
   a socket cover movable in a height direction of the socket main body with respect to the socket main body; and
   means for moving the placing plate between the semiconductor package placing position and the contact position in the height direction of the socket main body, wherein said placing plate is moved into said semiconductor package placing position when said socket cover is moved toward said placing plate, and said placing plate is moved into said contact position when said socket cover is moved away from said placing plate.

2. The socket connector of claim 1, wherein the solder balls of the semiconductor package are arranged in a grid, and the plurality of contacts are arranged in a corresponding grid shape.

3. The socket connector of claim 1, wherein the semiconductor package placing position is set to be away from the first and second contact pieces in a height direction of the socket main body by a length dimension corresponding to at least a diameter dimension of the solder ball.

4. The socket connector of claim 1, further including means for fixing the semiconductor package onto the placing plate in linking with the movement of the socket cover.

5. The socket connector of claim 1, further including means for displacing the first and second contact pieces in linking with the movement of the socket cover.

6. The socket connector of claim 1, further including means for fixing the semiconductor package onto the placing plate and means for displacing the first and second contact pieces.

7. The socket connector of claim 1, further including means for fixing the semiconductor package onto the placing plate.

8. The socket connector of claim 1, further including means for displacing the first and second contact pieces.

9. A socket connector for use with a semiconductor package, the semiconductor package including a plurality of solder balls on a bottom surface of the semiconductor package, the socket connector comprising:
    a plurality of contacts, arranged in a shape to correspond in arrangement to the solder balls, each contact having a first contact piece and a second contact piece, the first and second contact piece contactable with the corresponding solder ball;
    a socket main body equipped with the contacts;
    a placing plate moved between a semiconductor package placing position at which the semiconductor package is placed on the placing plate without contact of the solder balls of the semiconductor package with the first and second contact pieces, and a contact position at which the solder balls of the placed semiconductor package are contactable with the corresponding first and second contact pieces;
    a socket cover movable in a height direction of the socket main body with respect to the socket main body; and
    means for fixing the semiconductor package onto the placing plate in linking with the movement of the socket cover, wherein said semiconductor package is affixed to the placing plate when said socket cover is moved away from said placing plate.

10. The socket connector of claim 9, wherein the solder balls of the semiconductor package are arranged in a grid, and the plurality of contacts are arranged in a corresponding grid shape.

11. The socket connector of claim 9, wherein the semiconductor package placing position is set to be away from the first and second contact pieces in a height direction of the socket main body by a length dimension corresponding to at least a diameter dimension of the solder ball.

12. The socket connector of claim 9, further including means for moving the placing plate between the semiconductor package placing position and the contact position in the height direction of the socket main body in linking with movement of the socket cover.

13. The socket connector of claim 9, further including means for displacing the first and second contact pieces in linking with the movement of the socket cover.

14. The socket connector of claim 9, further including moving means for moving the placing plate between the semiconductor package placing position and the contact position in the height direction of the socket main body, and means for displacing the first and second contact pieces.

15. The socket connector of claim 9, further including moving means for moving the placing plate between the semiconductor package placing position and the contact position in the height direction of the socket main body.

16. The socket connector of claim 9, further including means for displacing the first and second contact pieces.

* * * * *